United States Patent [19]

Yoda et al.

[11] Patent Number: 4,725,780
[45] Date of Patent: Feb. 16, 1988

[54] RF FIELD GENERATOR AND DETECTOR

[75] Inventors: Kiyoshi Yoda; Satoshi Fujimura, both of Amagasaki, Japan

[73] Assignee: Mitsubishi Denki Kabushiki Kaisha, Japan

[21] Appl. No.: 789,040

[22] Filed: Oct. 18, 1985

[30] Foreign Application Priority Data

Oct. 19, 1984 [JP] Japan .................. 59-220907
Sep. 11, 1985 [JP] Japan .................. 60-201008

[51] Int. Cl.$^4$ ............................................. G01R 33/20
[52] U.S. Cl. ...................................... 324/318; 324/322; 343/744
[58] Field of Search ............... 324/307, 309, 318, 319, 324/320, 322; 335/299; 128/653; 333/219; 343/744, 859, 860

[56] References Cited

U.S. PATENT DOCUMENTS

| | | | |
|---|---|---|---|
| 2,166,750 | 7/1939 | Carter | 343/744 |
| 2,567,235 | 9/1951 | Rabuteau | 343/859 |
| 3,078,462 | 2/1963 | Herman | 343/744 |
| 4,439,733 | 3/1984 | Himshaw et al. | 324/322 |
| 4,616,181 | 10/1986 | Kemner et al. | 324/318 X |
| 4,621,237 | 11/1986 | Timms | 324/318 |
| 4,638,253 | 1/1987 | Jaskolski et al. | 324/318 |
| 4,641,097 | 2/1987 | Bottomley et al. | 324/318 |
| 4,649,348 | 3/1987 | Flugan | 324/318 |

FOREIGN PATENT DOCUMENTS 1329776 9/1973 United Kingdom ............ 324/318

OTHER PUBLICATIONS

B. M. Moores et al., VHF ... Duplexers, Rev. Sci. Inst., vol. 41, Sep. 1971.
K. E. Kisman et al., Coupling ... Coil Probe, Rev. Sci. Inst., vol. 45, No. 9, Sep. 1974.
1982, Cook et al., Journal of Magnetic Resonance, pp. 346-349, "A Large-Inductance, High-Frequency, High-Q, Series-Tuned Coil for NMR".
1979, Alderman et al., Journal of Magnetic Resonance, pp. 447-451, An Efficient Decoupler Coil Design Which Reduces Heating in Conductive Samples in Superconducting Spectrometers.

Primary Examiner—Stewart J. Levy
Assistant Examiner—Scott M. Oldham
Attorney, Agent, or Firm—Leydig, Voit & Mayer

[57] ABSTRACT

An RF field generator and detector comprising an RF coil having an inductance and at least one conductor which includes at least first and second separated parts arranged to form stray capacitance between them, capacitors for impedance matching which are connected to the RF coil, and a balanced-to-unbalanced transformer by which a balanced load composed of the RF coil and the capacitors is coupled to an unbalanced RF transmitter and receiver, the stray capacitance being adjusted thereby to equivalently reduce the inductance of the RF coil.

23 Claims, 9 Drawing Figures

RF FIELD GENERATOR AND DETECTOR

BACKGROUND OF THE INVENTION

This invention relates to RF field generators and detectors, and more particularly to an RF field generator and detector for an NMR apparatus.

Heretofore, an RF field generator and detector of the specified type has been as shown in FIG. 8. Referring to the figure, numeral 1 designates an RF or high frequency coil, for example, saddle-shaped coil or solenoid coil, numerals 2 designates variable capacitors for impedance matching which are connected to the RF coil, and numeral 3 designates connection terminals which serve to couple the RF field generator and detector with an RF transmitter and receiver (not shown). Since the impedance of the RF coil 1 differs from the input and output impedances of the RF transmitter and receiver, the variable capacitors 2 function to match the impedance of the two.

FIG. 9 shows an example of the RF coil 1 which is used in the prior-art RF field generator and detector shown in FIG. 8. Numeral 4 indicates a copper wire which forms the RF coil 1, and to which electrodes 5 are connected. When the copper wire 4 is supplied with an RF current from the electrodes 5, an RF magnetic field 6 is produced.

The prior-art RF field generator and detector is constructed as described above. Therefore, in a case where it is operated with a comparatively high frequency above 25 MHz, especially above 40 MHz by way of example, the impedance of the RF coil increases, and relatively, the capacitances of the variable capacitors for impedance matching become too small, so that the construction of the RF field generator and detector is difficult. Besides, the breakdown voltages of the variable capacitors must be enhanced with the increase of the impedance of the RF coil, and this renders the variable capacitors large in size and high in price.

SUMMARY OF THE INVENTION

This invention has been made in order to solve the problems as described above, and has for its object to facilitate the construction of variable capacitors for impedance matching.

An RF field generator and detector according to a first aspect of this invention comprises an RF coil having an inductance and at least one conductor which includes at least first and second separate parts arranged to form stray capacitance between them, capacitors for impedance matching which are connected to said RF coil, and a balanced-to-unbalanced transformer by which a balanced load composed of said RF coil and said capacitors is coupled to an unbalanced RF transmitter and receiver.

Besides, an RF field generator and detector according to a second aspect of this invention comprises an RF coil having an inductance and at least one conductor which includes at least first and second separated parts arranged to form stray capacitance between them, capacitors for impedance matching, an impedance transformer which couples said RF coil and said capacitors, and a balanced-to-balanced transformer by which a balanced load composed of said RF coil, said capacitors and said impedance transformer is coupled to an unbalanced RF transmitter and receiver.

Further, an RF field generator and detector according to a third aspect of this invention comprises an RF coil having an inductance and at least one conductor which includes at least first and second separated parts arranged to form stray capacitance between them, capacitors for impedance matching which are connected to said RF coil, a balanced-to-unbalanced transformer by which a balanced load composed of said RF coil and said capacitors is coupled to an unbalanced RF transmitter and receiver, and an impedance transformer which is interposed between the balanced-to-unbalanced transformer and connection terminals of the RF transmitter and receiver.

Still further, an RF field generator and detector according to a fourth aspect of this invention comprises an RF coil having an inductance and at least one conductor which includes at least first and second separated parts arranged to form stray capacitance between them, capacitors for impedance matching, a first impedance transformer which couples said RF coil and said capacitors, a balanced-to-unbalanced transformer by which a balanced load composed of said RF coil, said capacitors and said first impedance transformer is coupled to an unbalanced RF transmitter and receiver, and a second impedance transformer which is interposed between the balanced-to-unbalanced transformer and connection terminals of the RF transmitter and receiver.

In the RF field generator and detector according to the first or third aspect of this invention, the stray capacitance is adjusted to equivalently reduce the inductance of the RF coil.

On the other hand, in the RF field generator and detector according to the second or fourth aspect of this invention, the stray capacitance is adjusted to equivalently render the impedance of the RF coil is equivalently transformed into a capacitive impedance.

PREFERRED EMBODIMENTS OF THE INVENTION

Figure 1:
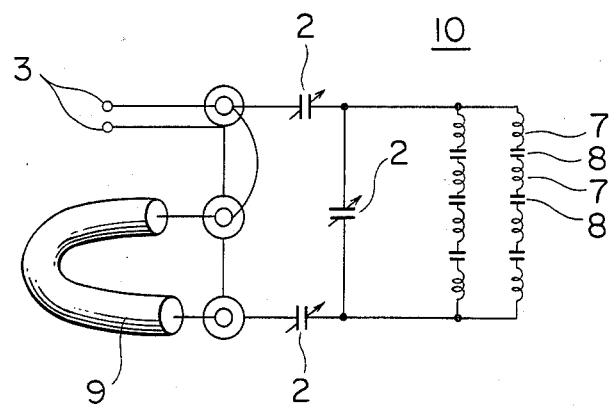
FIG. 1 is a circuit diagram showing an RF field generator and detector according to a first embodiment of this invention.

FIG. 1 is a circuit diagram which shows an RF field generator and detector according to the first embodiment of this invention. Numeral 10 designates an RF or high frequency coil which is divided in at least one place and which is formed with a stray capacitance at the place of division. Numeral 7 indicates the inductance of the RF coil 10, while numeral 8 indicates the stray capacitance thereof. Numeral 9 denotes a balanced-to-unbalanced transformer which couples a balanced load composed of the RF coil 10 and the foregoing variable capacitors 2, to the unbalanced RF transmitter and receiver stated before, and which is, for example, a coaxial cable as a transmission line having an electrical length of ½ wavelength.

Figure 2:
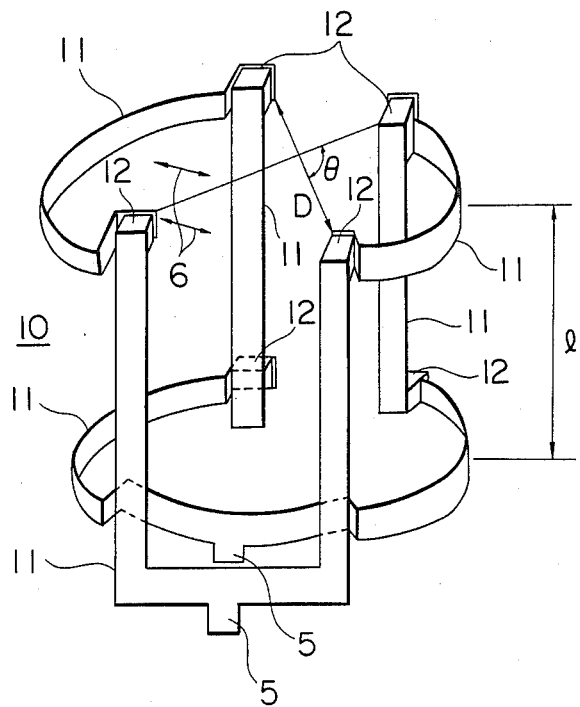
FIG. 2 is a perspective view showing an RF coil for use in this invention.

FIG. 2 shows a saddle-shaped coil as one example of the RF coil 10. Referring to the FIG., numerals 11 designate a plurality of metal members or sheets, for example, copper straps. Numerals 12 designate electric insulator members each of which is interposed between the adjacent metal members 11 so as to capacitively couple them. The coil diameter D and coil length l of the saddle-shaped coil are held in the relation of 0.7 D≦l≦2.4 D, and the angular aperture θ≦thereof is 100°≦θ140°. When these ranges are exceeded, the uniformity of an RF magnetic field is inferior, and a satisfactory result cannot be obtained.

First, the operation of the RF coil 10 will be described. In the structure of FIG. 2, when an RF current supplied across the electrodes 5 flows through the metal members 11 and the electric insulator members 12, an RF magnetic field 6 is generated. Due to the electric insulator members 12, stray capacitances C exist in series within the path of the current (refer to FIG. 1). In this regard, letting L denote the inductance of the RF coil 10 and letting C denote the electric insulator members 12, the impedance Z of the RF coil viewed from the electrodes 5 is approximately expressed as follows:

$$Z \approx j(\omega L - (1/\omega C)) + \gamma$$

Here, $\omega$ denotes the angular frequency of the RF current, and $\gamma$ denotes the RF resistance of the RF coil 10. Since the impedance $Z'$ of the prior-art RF coil 1 is:

$$Z' = j\omega L + \gamma$$

the inductance of the RF coil 10 can be equivalently changed by this invention. Moreover, when the impedance Z is rendered inductive by adjusting the stray capacitances C, an RF coil whose inductance is smaller than in the prior art is provided. In order to adjust the stray capacitances, the thickness or dielectric constant of the electric insulator members 12 may be changed, or the number of the coil division points or places to be capacitively coupled may be increased or decreased.

Since, in this manner, an RF coil having a small inductance can be provided, the capacitance of the variable capacitor which is used as an impedance matching unit for this RF coil can be made larger, and the breakdown voltage of the variable capacitor may be smaller. These will be explained with reference to FIG. 8. For the angular frequency $\omega$, the respective capacitances C and C' of the impedance matching variable capacitors 2 and 2 of the RF coil 1 (inductance L, RF resistance $\gamma$) are given by the following equations:

$$C \approx \frac{1 - \sqrt{\frac{\gamma}{R}}}{\omega^2 L}$$

$$C' \approx \frac{\sqrt{\frac{\gamma}{R}}}{\omega^2 L}$$

Here, R denotes the output impedance of an RF amplifier (not shown) for supplying electric power to the RF coil, and it is usually 50 Ω.

That is, when L is reduced, C and C' can be enlarged, and the impedance matching is facilitated. In addition, respective voltages $V_C$ and $V_{C'}$ across the capacitances C and C' are approximated to:

$$V_C = V_{C'} = j\omega LI + \gamma I$$

Thus, when L is reduced, the breakdown voltages of the capacitances C and C' can be lowered, and the variable capacitors can be rendered small in size and low in price.

Next, the operation of the first embodiment of this invention will be described with reference to FIG. 1. The impedance of the RF coil 10 is transformed into, for example, 200 Ω by the variable capacitors 2. Since the RF coil 10 is a balanced load, the variable capacitors 2 are used in a number of three as depicted in the figure to the end of holding the balance. Subsequently, the balanced load is transformed into an unbalanced impedance by the balanced-to-unbalanced transformer 9. By way of example, in a case where the balanced-to-unbalanced transformer 9 is a coaxial cable which has an electrical length of ½ wavelength with respect to the wavelength of the RF current to be fed to the RF coil 10, the impedance is transformed at 4:1, and hence, the impedance of the RF coil as viewed from the connection terminals 3 for the RF transmitter and receiver becomes 50 Ω. Since the input and output impedance of the RF transmitter and receiver are ordinarily 50 Ω, the above results in the matching of the impedance and makes it possible to efficiently generate and detect the RF field.

Figure 3:
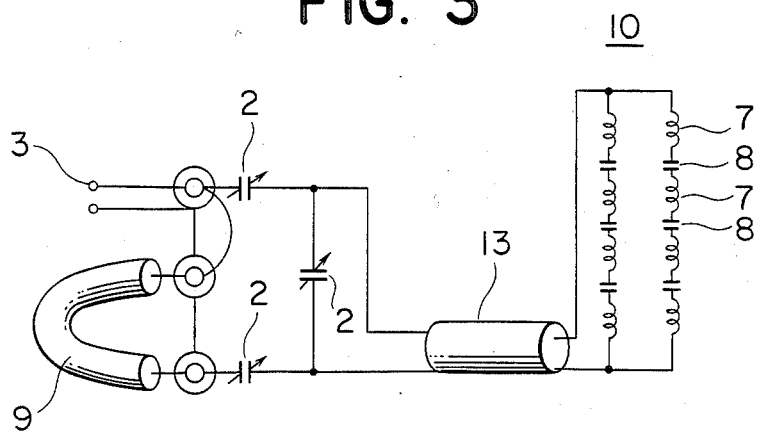
FIG. 3 is a circuit diagram showing an RF field generator and detector according to a second embodiment of this invention.

FIG. 3 shows a second embodiment of this invention. It differs from the embodiment shown in FIG. 1, in that an impedance transformer 13 for transforming a capacitive impedance into an inductive impedance, for example, a coaxial cable as a transmission line having an electrical length of ¼ wavelength is interposed between the RF coil 10 and the variable capacitors 2, and that the stray capacitance C is adjusted so as to render the impedance Z of the RF coil 10 capacitive. Owing to such an arrangement, likewise to the embodiment of FIG. 1, the embodiment of FIG. 3 becomes an RF coil whose inductance is equivalently made lower than in the prior art.

Next, the operation of the second embodiment of this invention shown in FIG. 3 will be described. The coaxial cable 13 having an electrical length of ¼ wavelength is connected to the RF coil 10 having a capacitive impedance, with the result that the impedance of the RF coil 10 is equivalently transformed into, an inductive impedance. Specifically, in a case where a load $Z_1$ is connected to a transmission line of characterisitic impedance $Z_0$, an impedance $Z_{in}$ with the load side viewed at a point which is ¼ wavelength distant from a load end is:

$$Z_{in} = (Z_0^2/Z_1)$$

and the impedance $Z_1 = (1/jX)$ being capacitive is transformed into the impedance $Z_{in} = jXZ_0^2$ being inductive. Subsequently, the transformed inductive impedance is transformed into, e.g., 200 Ω by the impedance matching variable capacitors 2. Further, the balanced load is transformed into an unbalanced impedance by the balanced-to-unbalanced transformer 9, and the impedance is simultaneously transformed at 4:1. Therefore, the impedance with the load side viewed from the connection terminals 3 becomes 50 Ω and matches with the impedance (ordinarily, 50 Ω and unbalanced) of the RF transmitter and receiver to be connected with the load, and it is made possible to efficiently generate and detect the RF field.

Figure 4:
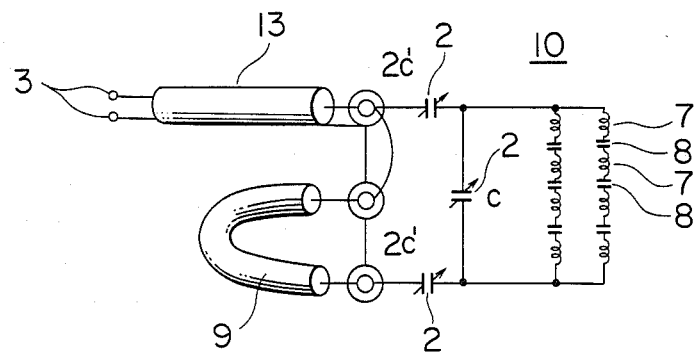
FIG. 4 is a circuit diagram showing a third embodiment of this invention.
Figure 5:
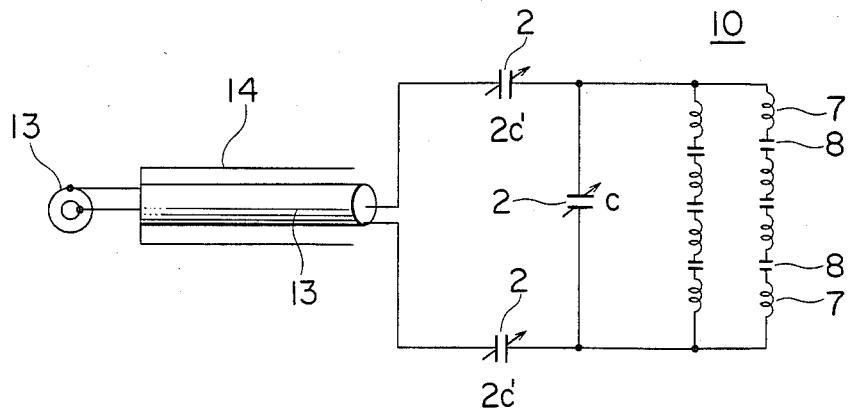
FIGS. 5 and 6 are circuit diagrams each showing a modification of the embodiment shown in FIG. 4.
Figure 6:
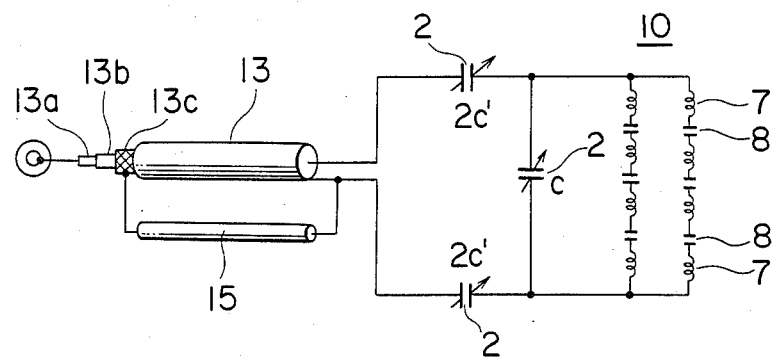
Figure 8:
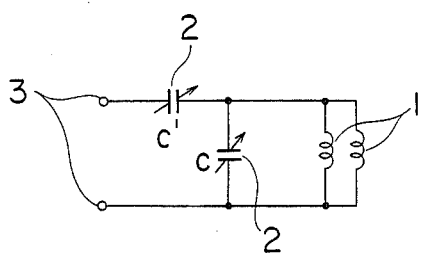
FIG. 8 is a circuit diagram showing an RF field generator and detector in a prior art.
Figure 9:
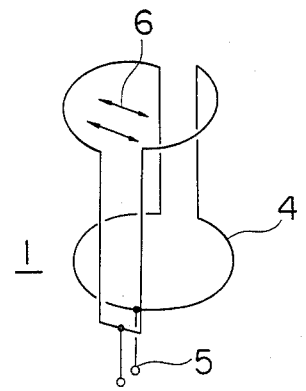
FIG. 9 is a perspective view showing an RF coil in the prior art.

FIG. 4 shows a third embodiment of this invention. This embodiment differs from the embodiment shown in FIG. 1, in that an impedance transformer 13, for example, a coaxial cable having an electrical length substantially equal to ¼ wavelength is interposed between the balanced-to-unbalanced transformer 9 and the connection terminals 3 for the RF transmitter and receiver. Although the impedance transformer is formed of the single coaxial cable in the illustration, it may well be composed of a plurality of coaxial cables connected in series. In FIGS. 4 through 6, the single variable capacitor 2 having the capacitance C' explained in conjunction with FIG. 8 is replaced with two variable capacitors 2 each having a capacitance 2C', and these capacitors are in a symmetric form or a balanced form. Accordingly, when L is reduced as described before, C and C' can be increased, and moreover, even when R is reduced, C' can be increased, so that the impedance matching is facilitated. Particularly, when operating the RF field generator and detector at a frequency higher than 40 MHz, C' might become below 1 pF, and the decrease of R has the effect of increasing C' to several pF or more and is favorable in the circuit arrangement.

Next, the operation of the third embodiment of this invention will be described with reference to FIG. 4. The impedance of the RF coil 10 is transformed into, for example, 76 Ω by the variable capacitors 2. Since the RF coil 10 is a balanced load, the variable capacitors 2 are used in a number of three as depicted in the figure to the end of holding the balance. Subsequently, the balanced load is transformed into an unbalanced impedance by the balanced-to-unbalanced transformer 9. By way of example, in a case where the balanced-to-unbalanced transformer 9 used is a coaxial cable which has an electrical length of ½ wavelength with respect to the wavelength of the RF current to be fed to the RF coil 10, the impedance is transformed at 4:1, and hence, the impedance becomes 19 Ω. Subsequently, assuming the characteristic impedance of the impedance transformer 13 to be 31 Ω, the impedance $Z_{in}$ viewed from the connection terminals 3 can be rendered $Z_{in} = (31^2/19) \approx 50$ owing to the ¼ wavelength. Since the input and output impedances of the RF transmitter and receiver are ordinarily 50 Ω, the above results in the matching of the impedances and makes it possible to efficiently generate and detect the RF field.

Thus far, the transmission line having the electrical length of ½ wavelength has been referred to as the balanced-to-unbalanced transformer 9. However, a Sperrtopf (wave trap) type balanced-to-unbalanced transformer may well be applied wherein as shown in a modified embodiment in FIG. 5, a cylindrical conductor 14 open at one side is fitted on the outer periphery of the impedance transformer 13, thereby to afford an electrical length of ¼ wavelength. In this case, the impedance transformation and the balanced-to-unbalanced transformation are simultaneously performed by the impedance transformer 13 and the cylindrical conductor 14. When the impedance with the load side viewed from the right end of the impedance transformer 13 is set at, e.g., 19 Ω, the impedance viewed from the connection terminals 3 for the RF transmitter and receiver becomes 50.

As the balanced-to-unbalanced transformer, it is also allowed to apply to a branch conductor type as shown in a modified embodiment in FIG. 6, employing a branch conductor 15 which is arranged in parallel with the coaxial cable being the impedance transformer 13, thereby to afford an electrical length of ¼ wavelength. Symbol 13a denotes the core conductor of the coaxial cable, symbol 13b denotes the insulator thereof, and symbol 13c denotes the mesh shield conductor thereof.

Figure 7:
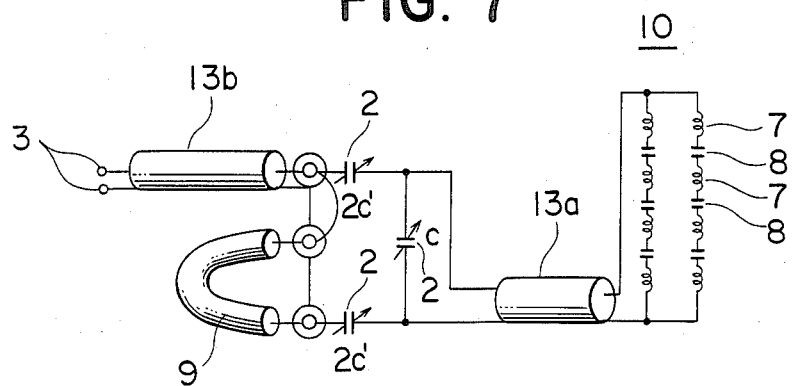
FIG. 7 is a circuit diagram showing a fourth embodiment of this invention.

FIG. 7 shows a fourth embodiment of this invention, which differs from the embodiment of FIG. 1 in the following points. A first impedance transformer 13a for transforming a capacitive impedance into an inductive impedance, for example, a coaxial cable as a transmission line having an electrical length being at least ¼ wavelength and less than ½ wavelength is interposed between the RF coil 10 and the variable capacitors 2; a second impednance transformer 13b, for example, a single coaxial cable having an electrical length substantially equal to ¼ wavelength or a plurality of such coaxial cables connected in series (not shown) is interposed between the balanced-to-unbalanced transformer 9 and the connection terminals 3 for the RF transmitter and receiver; and the stray capacitance C is adjusted to render the impedance Z of the RF coil 10 capacitive. Owing to such an arrangement, likewise to the embodiment of FIG. 1, the embodiment of FIG. 7 becomes an RF coil whose inductance is equivalently made lower than in the prior art.

Next, the operation of the fourth embodiment of this invention shown in FIG. 7 will be described. The coaxial cable as the first impedance transformer 13a having an electrical length of ¼ wavelength is connected to the RF coil 10 having a capacitive impedance, with the result that the impedance of the RF coil 10 is equivalently transformed into an inductive impedance. Specifically, in a case where a load $Z_l$ is connected to a transmission line of characteristic impedance $Z_0$, an impedance $Z_{in}$ with the load side viewed at a point which is ¼ wavelength distant from a load end is:

$$Z_{in} = (Z_0^2/Z_l)$$

and the impedance $Z_l = (1/jX)$ being capacitive is transformed into the impedance $Z_{in} = jXZ_0^2$ being inductive. Subsequently, the transformed inductive impedance is transformed into, e.g., 76 Ω by the impedance matching variable capacitors 2. Further, the balanced load is transformed into an unbalanced impedance by the balanced-to-unbalanced transformer 9, and the impedance is simultaneously transformed at 4:1 into 19 Ω. Further, it is transformed into 50 Ω by the second impedance transformer 13b. Accordingly, the load matches with the impedance (ordinarily, 50 Ω and unbalanced) of the RF transmitter and receiver to be connected with the load, and it is permitted to efficiently generate and detect the RF field.

Although, in the above embodiments, the copper sheets themselves as the metal members disposed in the axial direction or the peripheral direction have not been divided, each of them may well be further divided into a plurality of parts which are then capacitively coupled. The electric insulator may be either a solid or liquid dielectric or a gas such as air. The copper sheets may well be replaced with copper pipes, copper wires or the like, where the combination of such materials produces similar effects. The substance of the materials may well be a metal other than copper. In this case, connected portions function as part of the capacitance C.

Further, in the case where the electrical length of the coaxial cable as the first impedance transformer 13a in FIG. 7 is greater than ¼ wavelength but is less than ½ wavelength, a portion corresponding to a length of ¼ wavelength functions as the impedance transformer, and the remaining portion functions as part of the capacitance C.

As described above, according to this invention, a stray capacitance is formed in series with an RF coil for an NMR apparatus, so that the inductance of the RF coil can be equivalently reduced to facilitate the construction of an impedance matching unit. Besides, the stray capacitance is adjusted to equivalently render the impedance of the RF coil capacitive, and an impedance transformer is connected between the RF coil and variable capacitors, so that the inductance of the RF coil can be equivalently reduced to facilitate the construction of the impedance mathcing unit. A further effect is that the value of the capacitances 2C' of the variable capacitors can be increased by an impedance transformer which is interposed between a balanced-to-unbalanced transformer and connection terminals for an RF transmitter and receiver. This becomes important especially when operating the RF coil at a frequency higher than 40 MHz.

What is claimed is:

1. An RF field generator and detector comprising:
   an RF coil having an inductance and at least one conductor including at least first and second separated parts arranged to form stray capacitance therebetween;
   capacitors for impedance matching which are connected to said RF coil; and
   a balanced-to-unbalanced transformer by which a balanced load comprising said RF coil and said capacitors is coupled to an unbalanced RF transmitter and receiver, the stray capacitance being adjusted to equivalently reduce the inductance of said RF coil.

2. An RF field generator and detector according to claim 1 wherein said RF coil comprises a saddle-shaped coil.

3. An RF field generator and detector according to claim 1 further comprising:
   an electric insulator member positioned between said first and second separated parts, and
   wherein said at least first and second separated parts comprise metal members.

4. An RF field generator and detector according to claim 1 wherein said balanced-to-unbalanced transformer comprises a transmission line which has an electrical length of ½ wavelength.

5. An RF field generator and detector according to claim 4 wherein said transmission line comprises a coaxial cable.

6. An RF field generator and detector according to claim 1 wherein said capacitors for impedance matching are arranged in a balanced form.

7. An RF field generator and detector comprising:
   an RF coil having an inductance and at least one conductor including at least first and second separated parts arranged to form stray capacitance therebetween;
   capacitors for impedance matching;
   an impedance transformer which couples said RF coil and said capacitors; and
   a balanced-to-unbalanced transformer by which a balanced load comprising said RF coil, said capacitors, and said impedance transformer is coupled to an unbalanced RF transmitter and receiver, the stray capacitance being adjusted to equivalently render an impedance of said RF coil capacitive.

8. An RF field generator and detector according to claim 7 wherein said impedance transformer comprises a transmission line which has an electrical length being at least ¼ wavelength and less than ½ wavelength.

9. An RF field generator and detector comprising an RF coil having an inductance and at least one conductor including at least first and second separated parts arranged to form stray capacitance therebetween;
   capacitors for impedance matching which are connected to said RF coil;
   a balanced-to-unbalanced transformer by which a balanced load comprising said RF coil and said capacitors is coupled to an unbalanced RF transmitter and receiver; and
   an impedance transformer which is interposed between said balanced-to-unbalanced transformer and connection terminals for the RF transmitter and receiver, the stray capacitance being adjusted to equivalently reduce the inductance of said RF coil.

10. An RF field generator and detector according to claim 9 wherein said RF coil comprises a saddle-shaped coil.

11. An RF field generator and detector according to claim 9 further comprising:
    an electric insulator member positioned between said first and second separated parts, and wherein said at least first and second separated parts comprise metal members.

12. An RF field generator and detector according to claim 9 wherein said impedance transformer comprises a coaxial cable which has an electrical length substantially equal to ¼ wavelength.

13. An RF field generator and detector according to claim 9 wherein said impedance transformer comprises a plurality of serially connected coaxial cables which have an electrical length substantially equal to ¼ wavelength.

14. An RF field generator and detector according to claim 9 wherein said capacitors for impedance matching are arranged in a balanced form.

15. An RF field generator and detector according to claim 9 wherein said balanced-to-unbalanced transformer comprises a transmission line which has an electrical length of ½ wavelength.

16. An RF field generator and detector according to claim 15 wherein said transmission line comprises a coaxial cable.

17. An RF field generator and detector according to claim 9 wherein said balanced-to-unbalanced transformer comprises a Sperrtopf (wave trap) type transformer which has an electrical length of ¼ wavelength.

18. An RF field generator and detector according to claim 9 wherein said balanced-to-unbalanced transformer comprises a branch conductor type transformer which has an electrical length of ¼ wavelength.

19. An RF field generator and detector comprising:
    an RF coil having an inductance and at least one conductor including at least first and second separated parts arranged to form stray capacitance therebetween;
    capacitors for impedance matching;

a first impedance transformer which couples said RF coil and said capacitors;

a balanced-to-unbalanced transformer by which a balanced load comprising said RF coil, said capacitors, and said first impedance transformer is coupled to an unbalance RF transmitter and receiver;

and a second impedance transformer which is interposed between said balanced-to-unbalanced transformer and connection terminals for the RF transmitter and receiver, the stray capacitance being adjusted to equivalently render an impedance of said RF coil capacitive.

20. An RF field generator and detector according to claim 19 wherein said first impedance transformer comprises a transmission line which has an electrical length being at least ¼ wavelength and less than ½ wavelength.

21. An RF field generator and detector according to claim 19 wherein said second impedance transformer comprises a coaxial cable which has an electrical length substantially equal to ¼ wavelength.

22. An RF field generator and detector according to claim 19 wherein said second impedance transformer comprises a plurality of serially connected coaxial cables which have an electrical length substantially equal to ¼ wavelength.

23. An RF field generator and detector according to claim 19 further comprising:

an electric insulator member positioned between said first and second separated parts, and wherein said at least first and second separated parts comprise metal members.

* * * * *